(12) United States Patent
Tetzlaff

(10) Patent No.: US 6,973,420 B1
(45) Date of Patent: Dec. 6, 2005

(54) DIGITAL CIRCUIT SIMULATION

(75) Inventor: Thomas A. Tetzlaff, Portland, OR (US)

(73) Assignee: Intel Corporation, Santa Clara, CA (US)

(*) Notice: Subject to any disclaimer, the term of this patent is extended or adjusted under 35 U.S.C. 154(b) by 851 days.

(21) Appl. No.: 09/607,421

(22) Filed: Jun. 30, 2000

(51) Int. Cl.[7] .............................................. G06F 17/50
(52) U.S. Cl. .............................. 703/14; 703/22; 716/1; 716/4; 716/18
(58) Field of Search ..................... 703/14, 22; 716/1–4, 716/18

(56) References Cited

U.S. PATENT DOCUMENTS

| 5,991,523 A | * | 11/1999 | Williams et al. | ............... 716/18 |
| 6,496,038 B1 | | 12/2002 | Sprague et al. | ............... 326/95 |
| 6,531,897 B1 | | 3/2003 | Milshtein et al. | ............. 326/95 |
| 6,542,006 B1 | | 4/2003 | Sprague et al. | ............... 326/95 |
| 6,567,337 B1 | | 5/2003 | Sprague et al. | ............. 365/233 |

OTHER PUBLICATIONS

Bening, "A Two-State Methodology for RTL Logic Simulation," Proceedings of the 36th Design Automation Conference, pp. 672-677 (Jun. 1999).*
Smith, "Set-and-See Switch-Level Simulation for VLSI Functional Verification," IEEE 39th Midwest Symposium on Circuits and System, vol. 1 pp. 402-405 (Aug. 1996).*
Maxfield, "Xs' in Digital Simulation: Beware, Here be Dragons," EDN Access, downloaded text from http://www.e-insite.net/ednmag/archives/1995/101295/21df4.htm (Oct. 1995).*
Van Gendered, "Network Intialization in a Switch-Level Simulator," Proceedings of the 1995 European Design and Test Conference, p. 596 (Mar. 1995).*
Anonymous, "IEEE Standard Multivalue Logic System for VHDL Model Interoperability (Std_logic_1164)," IEEE Standards Board, pp. 1-17 (Mar. 1993).*
Cheng et al, "A Sequential Circuit Test Generator Using Threshold-Value Simulation," 18th International Symposium on Fault-Tolerant Computing, pp. 24-29 (Jun. 1988).*
Bryant, R.E., "A Switch-level Model and Simulator for MOS Dogital Systems", *IEEE Transactions on Computers, C-33*, 2, 160-177, (Feb. 1984).
Bryant, R.E., "Algorithmic Aspects of Symbolic Switch Network Analysis", *IEEE Transactions on Computer-Aided Design*, vol. CAD-6, 618-633, (Jul. 1987).
Bryant, R.E., "Boolean Analysis of MOS Circuits", *IEEE Transactions on Computer-Aided Desing*, vol. CAD-6, 634-649, (Jul. 1987).
Wehbeh, Jalal A., et al., "On the Initialization of Sequential Circuits", *Proc. IEEE International Test Conference*, (1994), 233-239.

* cited by examiner

*Primary Examiner*—Samuel Broda, Esq.
(74) *Attorney, Agent, or Firm*—Schwegman, Lundberg, Woessner & Kluth, P.A.

(57) ABSTRACT

A self-resetting circuit is simulated in a switch-level simulator using simulation models that can conditionally treat an unknown value on an input node as a known value. An attribute is included with the simulation model. The attribute specifies to the simulator whether to treat an unknown value as a logical zero or a logical one. A single attribute can be associated with the simulation model, or one attribute can be associated with each input node. Self-resetting circuits can be simulated from an initial state that includes unknown states. The proper logical initialization behavior can be simulated while still allowing the self-resetting circuit to propagate unknown states during normal operation and simulation.

20 Claims, 5 Drawing Sheets

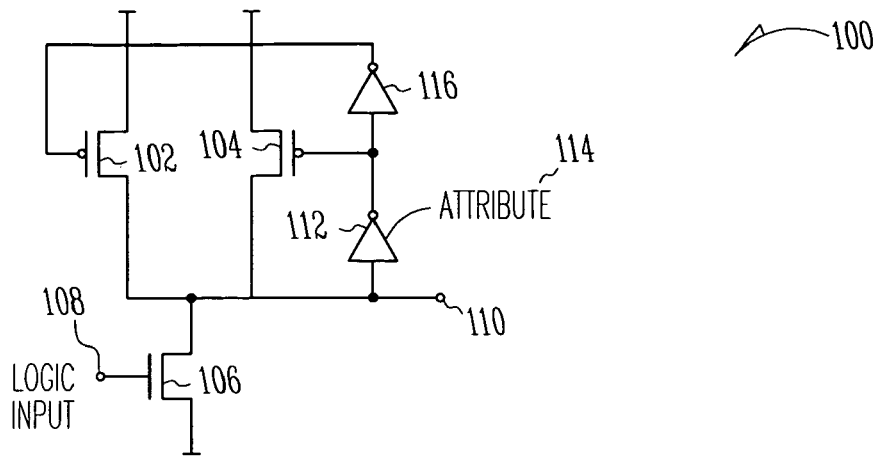
Fig.1
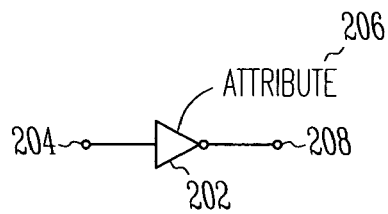
Fig.2A
| | INPUT | ATTRIBUTE | OUTPUT |
|---|---|---|---|
| 252 | 0 | – | 1 |
| 254 | 1 | – | 0 |
| 256 | X | CLEAR | X |
| 258 | X | SET | 1 |
Fig.2B

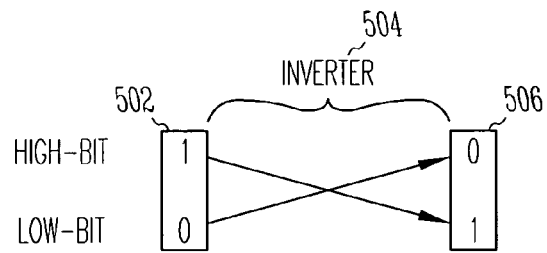
*Fig. 4*
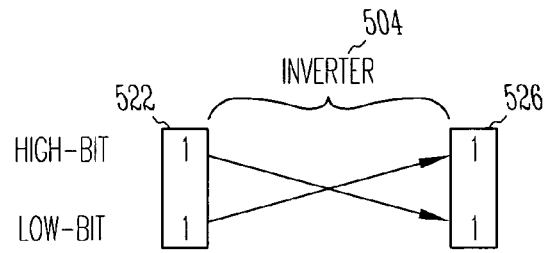
*Fig. 5A*
*Fig. 5B*
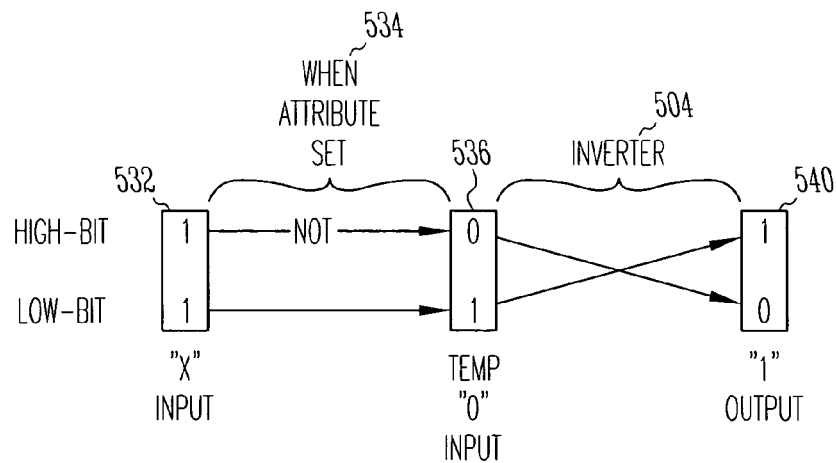
*Fig. 5C*

DIGITAL CIRCUIT SIMULATION

FIELD

The present invention relates generally to the simulation of digital circuits, and more specifically to the switch-level simulation of digital circuits.

BACKGROUND OF THE INVENTION

Switch-level simulators typically represent node values in a digital circuit as zero, one, and "unknown," and nodes are evaluated on a cycle-by-cycle basis. During each cycle, values present on input nodes to a block are used to evaluate output nodes of the block. For example, when simulating an inverter with a logical one on an input node, a switch-level simulator will evaluate the output node to a logical zero on the next cycle.

When a value of "unknown" is present on an input node, switch-level simulators typically evaluate the output node to a value of "unknown." This can be useful to alert a simulation user that a node has not been properly initialized, or that there is possibly a design flaw in the digital circuit being simulated.

Some digital circuits, during actual operation, will always evaluate an output node to the same value when a value of "unknown" is present on an input node. For example, when power is applied to a circuit, all node values are initially unknown, but many circuits always initialize nodes to the same value. These circuits, while having predictable behavior during actual operation, tend to propagate "unknown" node values during initialization of switch-level simulations.

One known method for initializing nodes in a simulation includes forcing node values to a known value. Such an approach is discussed in: A. J. van Genderen, "Network Initialization in a Switch-Level Simulator," Proc. IEEE European Design and Test Conference, p. 596, 1995. Another known method includes structural decomposition of sequential circuits. Such an approach is discussed in: Jalal A. Wehbeh and Daniel G. Saab, "On the Initialization of Sequential Circuits," Proc. IEEE International Test Conference, pp. 233–239, 1994. These and other prior art initialization approaches typically remove unknown values from nodes at the beginning of simulation.

In some circuits, unknown values can occur not just at initialization, but also during simulation. Circuits with asynchronous loops that experience a node value of "unknown" during switch-level simulation typically propagate the unknown value throughout the asynchronous loop. Regardless of whether the circuit always recovers from the unknown state to the same known state during actual operation, the switch-level simulation typically tends to continue to propagate the unknown value throughout the asynchronous loop. As a result, the switch-level simulation may not accurately reflect the actual operation of the circuit being simulated.

For the reasons stated above, and for other reasons stated below which will be appreciated by those skilled in the art upon reading and understanding the present specification, there is a need in the art for an alternate method and apparatus to simulate circuits that can have unknown node values.

BRIEF DESCRIPTION OF THE DRAWINGS

FIG. 1 shows a digital circuit;
FIGS. 2A and 2B show a simulation model of an inverter and a function table therefor;
FIG. 4 shows a table of simulation node states in a switch-level simulator;
FIGS. 5A–5C show an inverter function in a switch-level simulator.

DESCRIPTION OF EMBODIMENTS

Figure 3A:
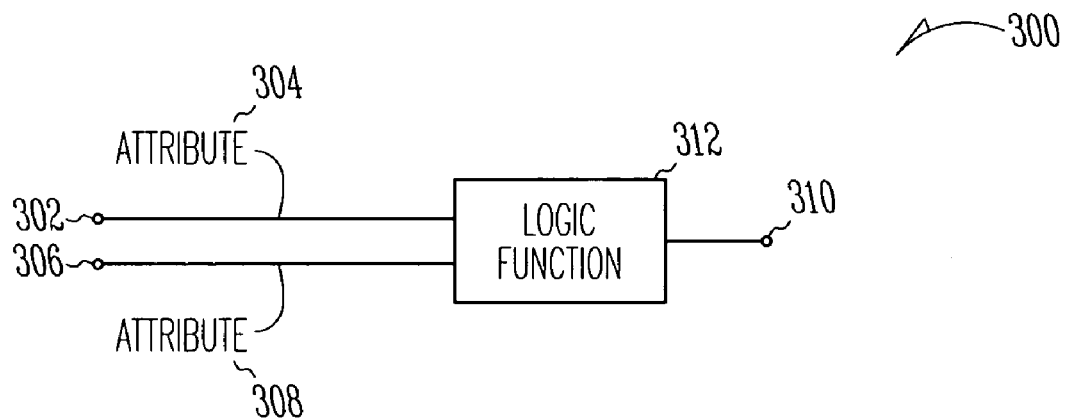
FIGS. 3A and 3B show diagrams of simulation models.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism for simulating digital circuits in a switch-level simulator. In some embodiments, a switch-level simulator has three valid values for each node within a network of nodes: logical zero, logical one, and "unknown." For the purposes of this description, the "unknown" value is represented by the letter "X." When an X appears on an input node, it is propagated to an output node. Self-resetting circuits include an asynchronous loop that evaluates to a known value in the actual circuit, but that does not necessarily evaluate to a known value in switch-level simulators. The method and apparatus of the present invention provide an attribute to be included on a simulation model. The attribute is interpreted by the simulator, and the simulator conditionally treats an X on an input node as a known value. When the attribute is used on strategically placed models within a simulation of a self-resetting circuit, the correct simulation behavior is achieved.

FIG. 1 shows a digital circuit. Digital circuit 100 includes P-channel transistors 102 and 104, N-channel transistor 106, and inverters 112 and 116. Digital circuit 100 is a generalized logic circuit, presented in simple form to aid in the discussion of the present invention. For example, circuit 100 is shown including a single N-channel transistor beneath the parallel P-channel transistors. With this single N-channel transistor, circuit 100 performs the function of an inverter. When the voltage on logic input node 108 is high, the voltage present on logic output 110 is low. Likewise, when the voltage on logic input node 108 is low, the voltage present on logic output node 110 is high.

In practice, N-channel transistor 106 can be replaced with multiple transistors in series, in parallel, or in any combination thereof. For example, when two N-channel transistors are in series, a NAND gate is formed. When both input voltages are high, the output voltage will go low. Also for example, when two N-channel transistors are in parallel, a NOR gate is implemented. In the NOR gate example, the output presents a low voltage when either input voltage is high.

The N-channel transistors are collectively termed the "N-stack." The N-stack implements a logic function that, when satisfied, presents a low voltage on logic output node 110. In operation, the voltage on logic output node 110 of digital circuit 100 will go low when the N-stack provides a path to ground. P-channel transistors 102 and 104 are smaller in size than transistors in the N-stack, and so can be overdriven by the N-stack.

When logic output node 110 above the N-stack is pulled down to a low voltage by the N-stack, and then the path through the N-stack goes to a high impedance, the combination of P-channel transistors 102 and 104 and inverters 112 and 116 automatically cause the voltage on logic output node 110 to reset to a high voltage. Inverter 112 drives P-channel transistor 104 off, and inverter 116 drives P-channel transistor 102 on, which pulls up logic output node 110 to a high voltage. After logic output node 110 transitions to a high voltage, inverter 112 drives P-channel transistor 104 on, and the circuit reaches steady state with logic output node 110 at a high voltage. The "self-resetting" action just described gives rise to the name "self-resetting circuit." The path through the inverter chain to P-channel transistor 102 and back to logic output 110 is termed the "self-reset path." After output node 110 is reset to a high voltage, inverter 112 and P-channel transistor 104 act to maintain or "keep" the output high until some later time when the N-stack inputs cause node 110 to go low. This is termed the "keeper path."

Digital circuit 100 can be simulated in a switch-level simulator. Conventional switch-level simulators typically represent circuit components as switches that are open or closed, and as logic gates that drive logical values of zero, one, and X onto circuit nodes. A switch-level simulator can generally accurately simulate the self-resetting behavior described above with respect to the N-stack pulling the output node low and the self-resetting path pulling the output back high. Correctly evaluating the value of logic output node 110 when an X is in present in the circuit, however, can present a challenge. For example, when the simulator initializes the circuit (which is a simulation of the power-on sequence), the simulator attempts to evaluate logic states of the various nodes in the circuit. Logic output node 110 initially has a value of X. As previously described, the real circuit will evaluate the output to a high voltage because, even with an unknown value on the output, either the self-reset path or the keeper path is eventually active. Conventional switch-level simulators, however, do not model the phenomena that cause the real circuit to reach steady state. In this case, with X values on both of the P-channel transistor inputs, the simulator allows for the possibility that both transistors might be off, while in reality one or the other must eventually be on. The simulator has trouble initializing the self-resetting circuit in part because, an asynchronous loop is formed from logic output node 110, through the inverter chain that includes inverters 116 and 112, and through P-channel transistors 102 and 104.

Whenever logic output node 110 is driven to a low voltage, each node in the self-reset path, both in the real circuit and in a simulation, evaluate to a known state. When during the simulation, an input node to the N-stack presents an X, conventional switch-level simulators will propagate the X to logic output node 110. After the X on the N-stack input is driven with either a logical one or zero, the switch-level simulator will continue to propagate an X onto logic output node 110 because the asynchronous self-reset path will continue to evaluate to unknown values.

Attribute 114 on inverter 112 is an attribute on a simulation model that can be interpreted by a switch-level simulator. When the simulator detects an X on the input node to inverter 112, the simulator checks the state of attribute 114. If the attribute is set, then the X on the inverter input is treated as a logical zero rather than an unknown state. Any simulation model within circuit 100 can have an attribute such as attribute 114. By placing attribute 114 on inverter 112, the behavior of the asynchronous self-reset loop can be modeled more accurately, in part because X's can be propagated to the logic output node 110 by the N-stack, but will not be unnecessarily held there by the self-reset circuit. As soon as the N-stack evaluates to a known value, logic output node 110 also evaluates to a known value. In other words, when the real circuit behavior will always reset logic output node 110 to a high voltage, the switch level simulator will always evaluate logic output node 110 to a logical one.

Attribute 114 allows the switch level simulator to initialize the circuit correctly, as well as more accurately model the behavior of the circuit when an X is present in the circuit during an on-going simulation. The inverter chain that includes inverter 112 and 116 can include additional inputs for purposes such as clock gating, and clock stopping. The placement of attribute 114 on inverter 112 allows these additional inputs to continue to function correctly.

FIG. 2A shows a diagram of a simulation model of an inverter. Inverter model 202 has attribute 206 associated therewith. Input node 204 is an input to inverter model 202, which produces a value on output node 208. When a logical zero appears on input node 204, a simulator will evaluate output node 208 to a logical one. Likewise, when a logical one appears on input node 204, the simulator will evaluate output node 208 to a logical zero. When an X appears on input node 204, the switch-level simulator will propagate the X to output node 208. Attribute 206 can be utilized to alter the behavior of the switch-level simulator such that the X on input node 204 is not necessarily propagated to output node 208. In some embodiments, attribute 206 is a Boolean variable capable of having one of two states. In other embodiments, attribute 206 is a multi-valued variable.

FIG. 2B shows a function table for the simulation model shown in FIG. 2A. Entries 252 and 254 show the normal operation of an inverter. For example, entry 252 shows that the output can be evaluated to a logical one when the input is at a logical zero. Entry 254 shows that the output can be evaluated to a logical zero when the input is at a logical one. Entries 256 and 258 show the operation of inverter model 202 (FIG. 2A) when an X is present on input node 204.

When attribute 206 is clear, as shown in entry 256, the switch-level simulator propagates an X from input node 204 to output node 208. In contrast, when attribute 206 is set, the switch-level simulator treats an X on input node 204 as a logical zero, and evaluates output node 208 to a logical one. In the embodiment shown in FIG. 2B, attribute 206 is a Boolean variable capable of being either clear or set. When set, an unknown value on an input node is treated as a logical zero. In other embodiments, an unknown value on an input node can be treated as a logical one. In still other embodiments, where attribute 206 is a multi-valued variable, an unknown value on an input node can be treated as either a logical zero or a logical one. Attribute 206 is shown as an attribute of inverter model 202.

FIG. 3A shows a diagram of a simulation model of a logic function. Simulation model 300 includes logic function 312 having input nodes 302 and 306, and output node 310. Logic function 312 can be any logic function capable of being simulated using a switch-level simulator. Examples include AND gates, OR gates, NAND gates, NOR gates, and the like. The switch-level simulator evaluates a value on output node 310 as a function of the values on input nodes 302 and 306. Input node 302 has attribute 304 associated therewith. Likewise, input node 306 has attribute 308 associated therewith. Each of attributes 304 and 308 affects how a switch-level simulator treats an unknown input value on nodes 302 and 306 respectively. For example, in some embodiments, when attribute 304 is set, a switch-level simulator will interpret an X on node 302 as a logical zero. In other embodiments, when attribute 304 is set, the switch-level simulator will interpret an X on node 302 as a logical one. Attribute 308 functions in the same way, and affects the switch-level simulator's behavior when an X is present on input node 306. In the embodiment of FIG. 3A, attributes 304 and 308 are attributes of input nodes, rather than attributes of logic function 312. This is in contrast to the embodiment shown in FIG. 2A, where attribute 206 is an attribute of inverter model 202, rather than an attribute of input node 204. It can be seen, therefore, that the method and apparatus of the present invention contemplate attributes associated with different types of entities in a simulation.

Figure 3B:
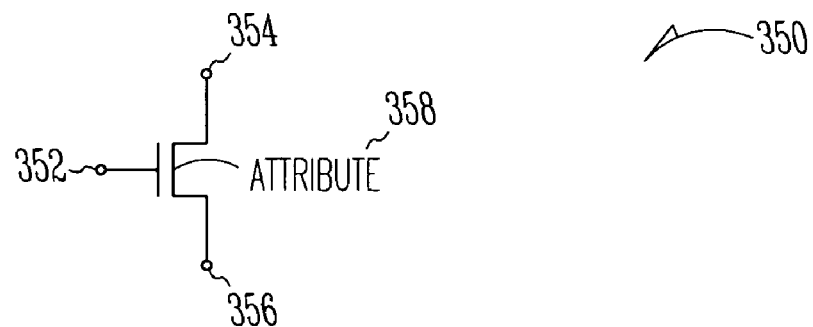

FIG. 3B shows a diagram of a simulation model of a transistor. Simulation model 350 is a model of a field effect transistor (FET). As used in a switch-level simulator, simulation model 350 appears as a switch. When the switch is closed, drain node 354 is coupled to source node 356, and when the switch is open, drain node 354 is not coupled to source node 356. The switch is closed when gate node 352 has a logical one imposed thereon, and is open when gate node 352 has a logical zero imposed thereon. Attribute 358 is associated with model 350. Like attributes discussed with reference to previous figures, attribute 358 can affect how a switch-level simulator interprets a value of X on a node. For example, if gate node 352 has a logical one imposed thereon, and attribute 358 is set, and drain node 354 has an X, the switch-level simulator can interpret the X as either a logical zero or logical one, and can propagate that value to source node 356. In the embodiment shown in FIG. 3B, attribute 358 is associated with the body of simulation model 350. In other embodiments, attributes are associated with each node, such as drain node 354 and source node 356.

FIG. 4 shows a table of simulation node states in a switch-level simulator. As shown in table 400, a switch-level simulator can represent node values of logical zero, logical one, and X, as a two bit word. The two bit word shown in table 400 includes two bits labeled HIGH_BIT and LOW_BIT. A logical zero is represented as a "01" pattern in the two bit word, a logical one is represented as a "10" pattern in the two bit word, and an X is represented as a "11" pattern. Table 400 shows one possible encoding for a logical zero, logical one, and X using a two bit word. Other encodings can be used without departing from the scope of the present invention. For example, an X can be represented as a "00" pattern and the patterns used for logical one and logical zero could be interchanged without departing from the scope of the present invention.

FIGS. 5A–5C show an inverter function in a switch-level simulator. FIG. 5A shows an input node value 502, output node value 506, and the operational mechanism 504 of an inverter simulation model. Input node value 502 has a HIGH_BIT value of one, and a LOW_BIT value of zero. As shown in table 400 (FIG. 4), this corresponds to a logical one on the input node to the inverter. Mechanism 504, which models an inverter, when evaluating output node value 506 from input node value 502, swaps the values of the HIGH_BIT and LOW_BIT. In some embodiments, the simulator implements a "MOV" operation that moves the HIGH_BIT to the LOW_BIT and vice versa. In the example of FIG. 5A, this creates a HIGH_BIT value of zero, and a LOW_BIT value of one on output node value 506. This corresponds to an output value of logical zero, which is the expected result from an inverter having an input value of logical one.

FIG. 5B shows the operation of the same inverter model having an X on the input node. Input node value 522 has a two bit word value of "11," which corresponds to an X. When inverter model mechanism 504 swaps the HIGH_BIT and the LOW_BIT, the X of input node value 522 is propagated to output node value 526. Again, this is the expected result in a switch-level simulator evaluating an output node value on an inverter having an unknown value on an input node.

FIG. 5C shows the action of an inverter model having an X on an input node, and having an attribute set. Input node value 532 is an X. This corresponds to an inverter having a value of X imposed on an input node. When the attribute is not set, the action is the same as that shown in FIG. 5B. That is to say, the X on the input node is propagated to the output node. When the attribute is set, however, the action of FIG. 5C takes place. The switch-level simulator treats an X on the input node of the inverter model as a logical zero, to produce a logical one on the output. In some embodiments, this is accomplished by inverting one bit of the two bit word representing input node value 532. Action 534 implements a "NOT" function to invert the HIGH_BIT of the two bit word to create a temporary logical zero, shown at temporary node value 536. The normal operation of the inverter model is then carried out having a logical zero as a temporary input value, and a logical one is produced on the output node as output node value 540.

FIGS. 5A–5C describe an example embodiment for treating an X on an input node of an inverter as a value other than X. The inverter mechanism is accomplished using the two bit word node representation by swapping bits in the word using a MOV operation. The method and apparatus of the present invention also apply to other types of circuits, such as more complex logic gates. More complex logic gates can utilize AND, OR, and other operations in addition to the MOV operations of the inverter model while still practicing the present invention. Regardless of the mechanism of the simulation model, the method and apparatus of the present invention can aid in the resolution of node values in the presence of unknown node values.

Figure 6:
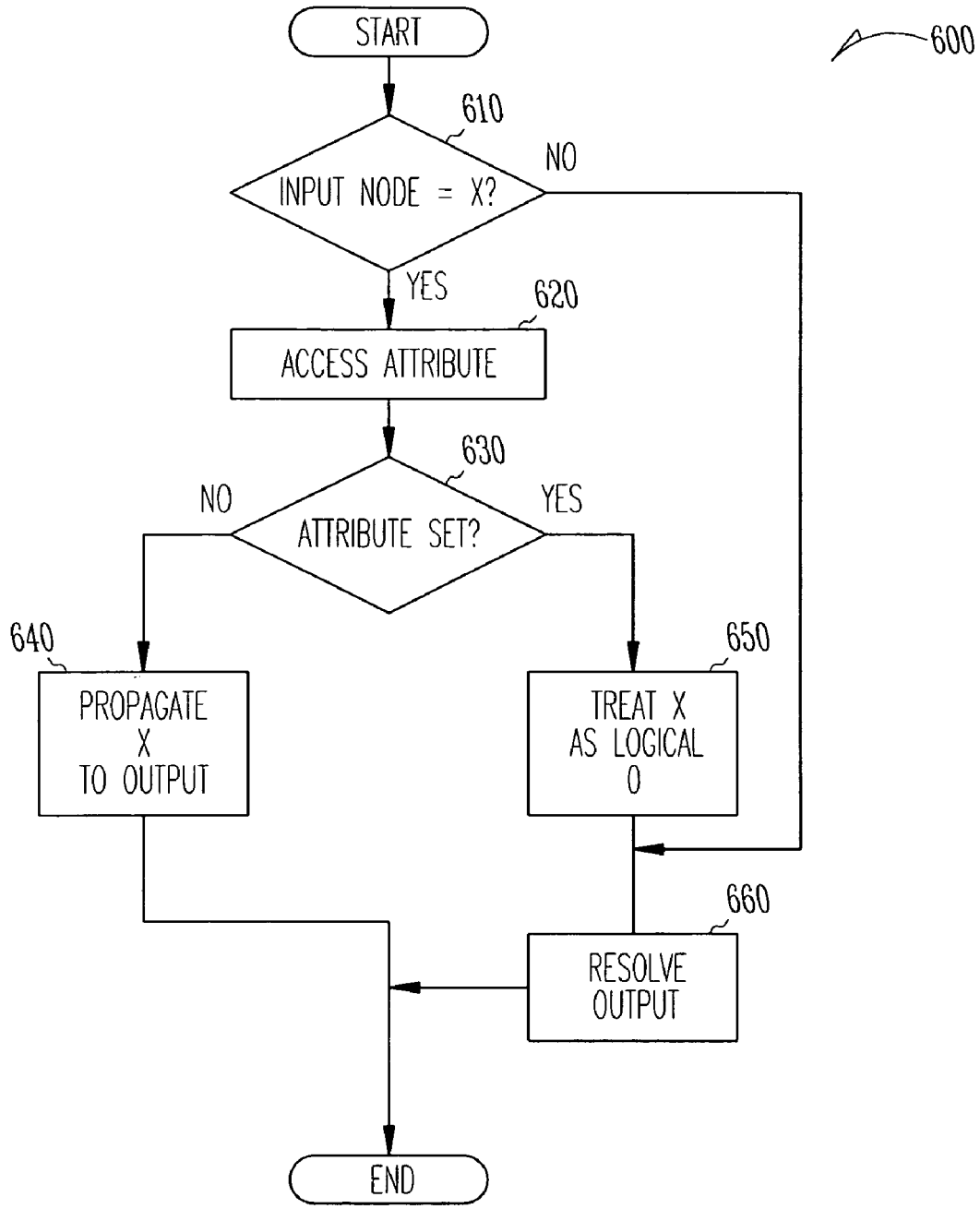
FIG. 6 shows a flowchart of a method of performing a simulation.

FIG. 6 shows a method of evaluating the value of a node in a simulation. Method 600 begins in decision block 610 where a determination is made whether an input node has a value of X. If not, method 600 continues with block 660, where the value on the output node is evaluated as a function of the inputs. For example, if the node being evaluated is the output node of an inverter, and the input node has a value of one, the output node will be assigned a value of zero. If, in decision block 610, it is determined that an input node has a value of X, method 600 continues in block 620.

In block 620, an attribute is accessed by the simulator. The attribute of block 620 can be an attribute on the input node having an X, or can be an attribute associated with the simulation model itself. The simulator determines whether the attribute is set in decision block 630. If the attribute is not set, method 600 continues with block 640, where the node is evaluated as if the X is present in the input node. This can include propagating the value of X to the node being evaluated, or can include evaluating the output node to a known value. For example if the gate is an inverter with an X on the input node, the X will be propagated to the output. If, on the other hand, the gate is a two input NAND gate with the other input node having a value of 0, the output node can be evaluated to a value of 1. If the attribute is set, method 600 transitions from decision block 630 to block 650 where the value of X on the input node is treated as a logical zero. Using the logical zero as the value on input node, method 600 continues with block 660 where the output node is evaluated. In the embodiment described in method 600, an unknown value is treated as a logical zero when the attribute is set. In other embodiments, the unknown value can be treated as a logical one.

Figure 7:
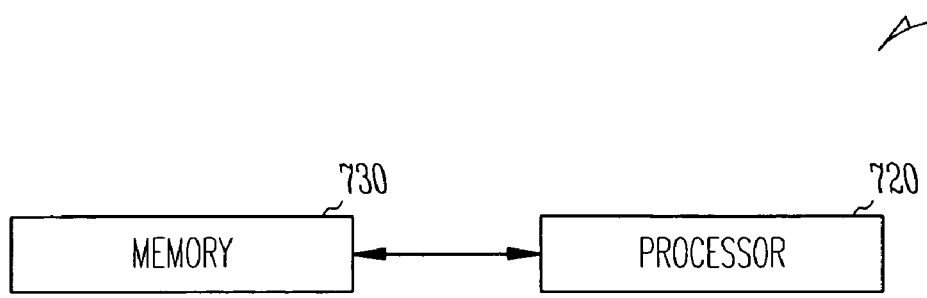
FIG. 7 shows a diagram of a processing system.

FIG. 7 shows a processing system. Processing system 700 includes processor 720 and memory 730. In some embodiments, processor 720 represents a computer that performs a simulation of a circuit such as circuit 100 (FIG. 1). In some embodiments, processor 720 is a processor capable of executing software embodiments of methods, such as that shown in FIG. 6. Processing system 700 can be a personal computer (PC), mainframe, handheld device, portable computer, set-top box, or any other system that includes software.

Memory 730 represents an article that includes a machine readable medium. For example, memory 730 represents any one or more of the following: a hard disk, a floppy disk, random access memory (RAM), read only memory (ROM), flash memory, CDROM, or any other type of article that includes a medium capable of holding information readable by processor 720. Memory 730 can store instructions for performing the execution of the various method embodiments of the present invention. Memory 730 can also be a memory for holding a data structure such as the data structure embodiment shown in FIG. 8.

Figure 8:
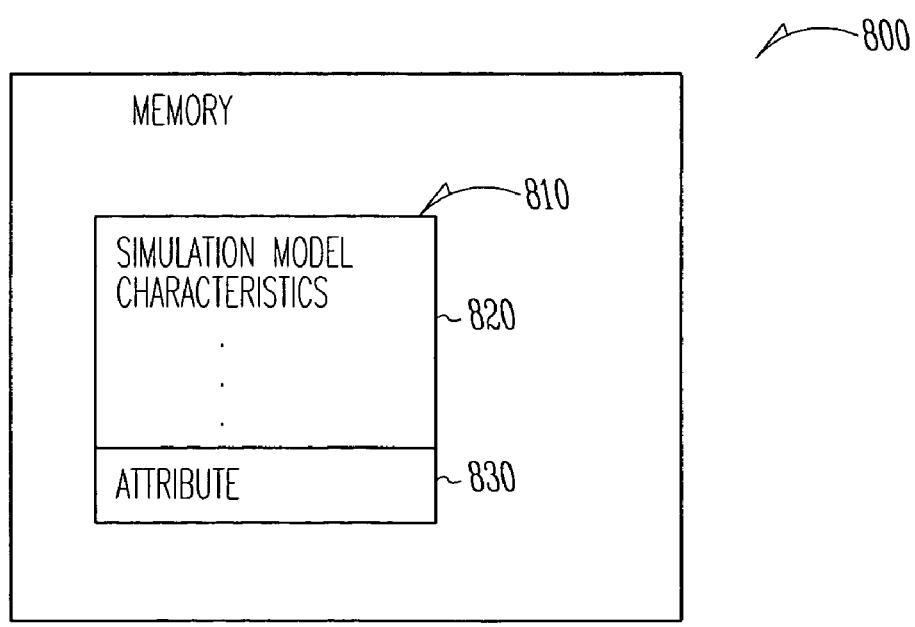
FIG. 8 shows a memory that includes a data structure.

FIG. 8 shows a memory holding a data structure describing a simulation model. Memory 800 includes data structure 810, which in turn includes simulation model characteristics 820 and attribute 830. Memory 800 can be any type memory capable of holding data structure 810. Examples include memory within a computer and media types useful for distribution. For example, memory 800 can be a CDROM or other disk holding data structure 810 along with other data structures that form a library of simulation models.

Data structure 810 includes simulation model characteristics 820 and attribute 830. Simulation model characteristics 820 include information describing the simulation model for use in simulation. For example, referring now back to FIG. 3A, a data structure entry describing logic function 312 would be included in simulation model characteristics 820. If logic function 312 were an AND gate, the AND gate logical function would be described in simulation model characteristics 820. Attribute 830 corresponds to attributes 304 and 308. When the simulation model described by data structure 810 includes multiple input nodes, multiple attributes 830 can be included, one associated with each input node. Alternatively, attribute 830 can be a single attribute associated with the entire simulation model rather than a particular input.

The method and apparatus of the present invention provide a mechanism for evaluating node values in a switch-level simulation in the presence of unknown input node values. In a self-resetting circuit, where the real circuit behavior will always evaluate the output node to a logical one after a path to ground has been removed, switch-level simulation can be problematic. The method and apparatus of the present invention can faithfully simulate the correct behavior of self-resetting circuits.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method of initializing a simulation comprising:
   accessing an attribute on a simulation model within a simulation of a self-resetting circuit; and
   responsive to the attribute, conditionally treating an unknown state of an input node on the simulation model as a known state.

2. The computer-implemented method of claim 1 wherein conditionally treating an unknown state comprises:
   when the attribute is set, evaluating an output node of the simulation model using the known state for the input node rather than the unknown state.

3. The computer-implemented method of claim 2 wherein evaluating an output node comprises detecting an X on the input node, and evaluating the output node as if a 0 was on the input node.

4. The computer-implemented method of claim 3 wherein the simulation model is a model of an inverter, and evaluating an output node comprises detecting an X on the input node, and evaluating the output node to a 1.

5. The computer-implemented method of claim 2 wherein evaluating an output node comprises detecting an X on the input node, and evaluating the output node as if a 1 was on the input node.

6. The computer-implemented method of claim 5 wherein the simulation model is a switch-level model of a transistor, and evaluating an output node comprises detecting an X on a gate node of the switch-level model of the transistor, and logically closing the switch-level model of the transistor.

7. The computer-implemented method of claim 1 wherein the self-resetting circuit comprises:
   a first P-channel transistor having a source coupled to a voltage supply and a drain;
   a second P-channel transistor having a source coupled to the voltage supply and a drain;
   a first inverter having an input coupled to the drain of the first P-channel transistor and the drain of the second P-channel transistor and an output coupled to a gate of the second P-channel transistor;
   a second inverter having an input coupled to the gate of the second P-channel transistor and an output coupled to a gate of the first P-channel transistor; and
   an N-channel transistor having a drain coupled to the drain of the first P-channel transistor and the drain of the second P-channel transistor and a source coupled to ground.

8. An article having a computer readable medium, the computer readable medium having instructions stored thereon for performing a method of initializing a device model in a simulation, the method comprising:
   accessing an attribute of the device model within a simulation of a self-resetting circuit to ascertain a state of the attribute; and
   responsive to the state of the attribute, conditionally treating an X on an input node of the device model as a value other than an X.

9. The article of claim 8 wherein the attribute is associated with the input node, the method further comprising:
   accessing a second attribute of the device model, the second attribute being associated with a second input node; and
   responsive to a state of the second attribute, conditionally treating an X on the second input node as a value other than an X.

10. The article of claim 8 wherein conditionally treating comprises:
    conditionally treating an X on any input node of the device model as a value other than an X.

11. The article of claim 8 wherein the device model is a model of an inverter, the simulation is a switch-level simulation, and conditionally treating comprises:
    when the attribute is set and an X is present on an input node to the model of the inverter, evaluating an output node of the model of the inverter to a 1.

12. The article of claim 8 wherein the device model is a model of an inverter, the simulation is a switch-level simulation, and conditionally treating comprises:
    when the attribute is set and an X is present on an input node to the model of the inverter, evaluating an output node of the model of the inverter to a 0.

13. The article of claim 8 wherein the device model is a model of a transistor, the simulation is a switch-level simulation, and conditionally treating comprises:
    when an X is present on a gate node of the model of the transistor, logically closing the model of the transistor.

14. The article of claim 8 wherein the self-resetting circuit comprises:
    a first P-channel transistor having a source coupled to a voltage supply and a drain;
    a second P-channel transistor having a source coupled to the voltage supply and a drain;
    a first inverter having an input coupled to the drain of the first P-channel transistor and the drain of the second P-channel transistor and an output coupled to a gate of the second P-channel transistor;
    a second inverter having an input coupled to the gate of the second P-channel transistor and an output coupled to a gate of the first P-channel transistor; and
    an N-channel transistor having a drain coupled to the drain of the first P-channel transistor and the drain of the second P-channel transistor and a source coupled to ground.

15. A computer-implemented method of initializing a simulation comprising:
    accessing a first attribute on a simulation model within a simulation of a self-resetting circuit;
    responsive to the first attribute, conditionally treating an unknown state of a first input node on the simulation model as a known state;
    accessing a second attribute on the simulation model within the simulation; and
    responsive to the second attribute, conditionally treating an unknown state of a second input node on the simulation model as a known state.

16. The computer-implemented method of claim 15, further comprising evaluating an output node of the simulation model as a function of a state of the first input node and a state of the second input node.

17. The computer-implemented method of claim 15 wherein the simulation model is a model of a logic function.

18. The computer-implemented method of claim 15 wherein the simulation model is a model of an AND gate, an OR gate, a NAND gate, or a NOR gate.

19. The computer-implemented method of claim 15, further comprising:
    when the first attribute is set, interpreting an unknown state of the first input node as a logical zero; and
    when the second attribute is set, interpreting an unknown state of the second input node as a logical zero.

20. The computer-implemented method of claim 15, further comprising:
    when the first attribute is set, interpreting an unknown state of the first input node as a logical one; and
    when the second attribute is set, interpreting an unknown state of the second input node as a logical one.

* * * * *